(12) United States Patent
Yoshikawa

(10) Patent No.: US 8,334,581 B2
(45) Date of Patent: Dec. 18, 2012

(54) SEMICONDUCTOR DEVICE EXHIBITING WITHSTAND VOLTAGES IN THE FORWARD AND REVERSE DIRECTIONS

(75) Inventor: Koh Yoshikawa, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 12/975,650

(22) Filed: Dec. 22, 2010

(65) Prior Publication Data

US 2011/0156210 A1    Jun. 30, 2011

(30) Foreign Application Priority Data

Dec. 28, 2009   (JP) ................. 2009-298913

(51) Int. Cl.
*H01L 27/082* (2006.01)
*H01L 27/102* (2006.01)

(52) U.S. Cl. ......... 257/565; 257/571; 438/205; 438/343

(58) Field of Classification Search .................. 257/565, 257/571, E29.198; 438/205, 343
See application file for complete search history.

(56) References Cited

U.S. PATENT DOCUMENTS

| | | | |
|---|---|---|---|
| 5,766,966 A * | 6/1998 | Ng | 438/138 |
| 2002/0048915 A1 | 4/2002 | Reznik | |

FOREIGN PATENT DOCUMENTS

| | | | |
|---|---|---|---|
| JP | 9-260662 | A | 10/1997 |
| JP | 9-326486 | A | 12/1997 |
| JP | 2002-319676 | A | 10/2002 |
| JP | 2002-532885 | A | 10/2002 |
| JP | 3395520 | B2 | 4/2003 |
| JP | 3458590 | B2 | 10/2003 |
| JP | 2006-080269 | A | 3/2006 |

* cited by examiner

*Primary Examiner* — Theresa T Doan
(74) *Attorney, Agent, or Firm* — Rossi, Kimms & McDowell LLP

(57) ABSTRACT

A semiconductor device according to embodiments of the invention includes an $n^-$-type drift region; a p-type base region formed selectively in the surface portion of the drift region; an $n^+$-type emitter region and a $p^+$-type body region, both formed selectively in the surface portion of base region; and an n-type shell region between the drift region and the base region, a shell region surrounding the entire region below base region. The shell region is doped more heavily than the drift region. The shell region contains an n-type impurity at an effective impurity amount of $8.0 \times 10^{11}$ cm$^{-2}$ or smaller. A drift region exhibits a resistivity low enough to prevent the depletion layer expanding from collector region, formed on the back surface of the drift region, toward a shell region from reaching the shell region.

7 Claims, 13 Drawing Sheets

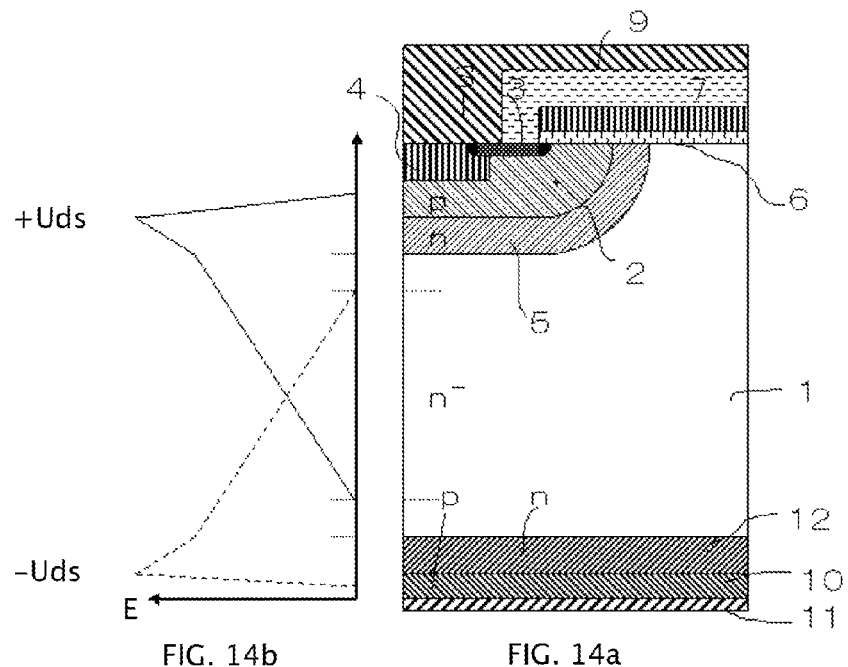
FIG. 14b   FIG. 14a
FIG. 15
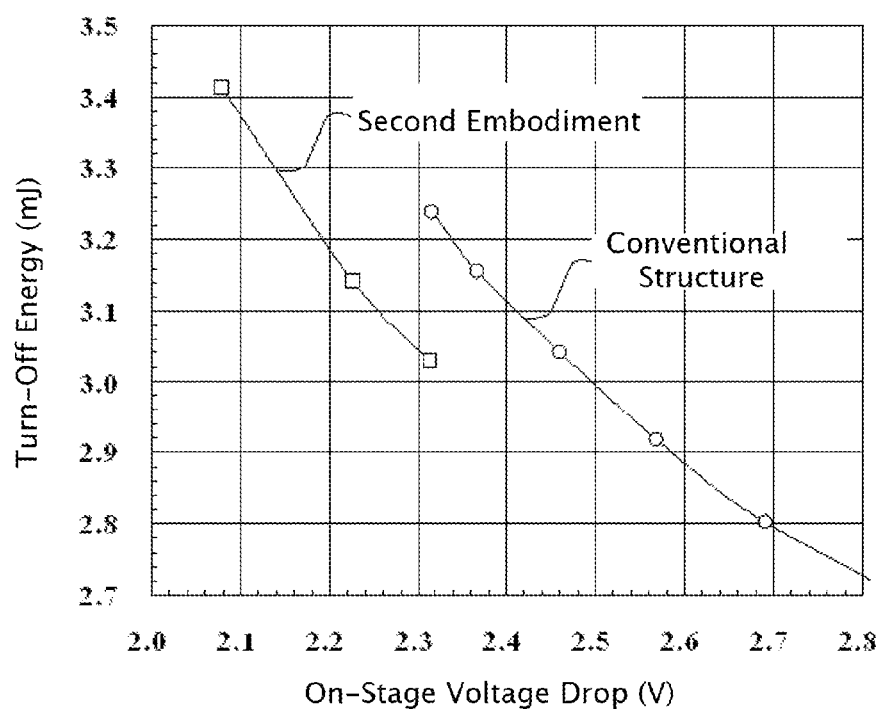

SEMICONDUCTOR DEVICE EXHIBITING WITHSTAND VOLTAGES IN THE FORWARD AND REVERSE DIRECTIONS

BACKGROUND

The present invention relates to a semiconductor device.

In the field of electric power converters using a semiconductor device, matrix converters have been known to the persons skilled in the art as direct converter circuits which conduct an alternating current to alternating current conversion (hereinafter referred to an "AC/AC conversion"), an alternating current to direct current conversion (hereinafter referred to an "AC/DC conversion") and a direct current to alternating current conversion (hereinafter referred to a "DC/AC conversion") without employing any DC smoothing circuit including an electrolytic capacitor and a DC reactor.

The matrix converter includes AC switches. Since an AC voltage is applied to the AC switches, it is required for the AC switches to exhibit withstand voltages in the forward and reverse directions. In other words, the AC switches are required to exhibit a forward withstand voltage and a reverse withstand voltage. From the view points of reducing the size, weight and costs of the matrix converter and improving the conversion efficiency and response speed thereof, bidirectional switching apparatuses have been attracting much attention. As one of the bidirectional switching apparatuses, a switch including two reverse blocking insulated gate bipolar transistors (hereinafter referred to as "reverse blocking IGBT's") connected in parallel to each other has been known to the persons skilled in the art.

In the following descriptions and the accompanying drawings, electrons or holes are the majority carries in the layers and regions prefixed with "n-type" or "p-type". The sign − on the shoulder of the letter "n" or "p" indicating the conductivity type of a region or a layer indicates that the region or the layer is doped relatively lightly. The sign + on the shoulder of the letter "n" or "p" indicating the conductivity type of a region or a layer indicates that the region or the layer is doped relatively heavily. When neither the sign + nor the sign − is fixed, the region or the layer is doped intermediately.

FIG. 11 is the cross sectional view of a conventional reverse blocking IGBT.

Referring now to FIG. 11, separation section 130 that surrounds active region 110 is formed in the edge area of an n-type semiconductor substrate in the reverse blocking IGBT. In active region 110, a vertical IGBT, including $n^-$-type drift region 1, p-type base region 2, $n^+$-type emitter region 3, and p-type collector region 10, is formed. In separation section 130, p-type separation region 31 is formed through the semiconductor substrate from the front surface thereof to the back surface thereof. Separation region 31 is in contact with collector region 10 formed on the active region 110 back surface. Between separation section 130 and active region 110, breakdown withstanding region 120 is formed. Breakdown withstanding region 120 relaxes the electric field strength on the pn-junction constituting the semiconductor device and realizes the desired withstand voltages.

FIG. 12 is a cross sectional view showing active region 110 in the semiconductor device shown in FIG. 11 in detail.

In active region 110, p-type base region 2 is formed selectively in the surface portion on the front side of drift region 1 formed of an $n^-$-type semiconductor substrate. Base region 2 is doped more heavily than drift region 1. In the base region 2 surface portion, $n^+$-type emitter region 3 and $p^+$-type body region 4 are formed selectively. Gate electrode 7 covers a part of $n^+$-type emitter region 3 and a part of base region 2 via gate insulator film 6. Emitter electrode 9 is in contact with emitter region 3 and body region 4. Emitter electrode 9 is insulated from gate electrode 7 by interlayer insulator film 8. On the drift region 1 back surface, p-type collector region 10 and collector electrode 11 are formed.

By employing a silicon (Si) substrate fabricated by the floating zone method (hereinafter referred to as the "FZ method"), the reverse blocking IGBT as described above is formed to be a non-punch-through-type (hereinafter referred to as an "NPT-type") one, in which the depletion layer expanding from the emitter in the OFF-state of the reverse blocking IGBT does not reach the collector. Due to the technical improvement for polishing the silicon substrate fabricated by the FZ method, it is possible to thin the silicon substrate to be around 100 μm in thickness at the IGBT rated voltage of 600 V and to be around 180 μm in thickness at the IGBT rated voltage of 1200 V. By thinning the collector region and by lowering the impurity concentration in the collector region, the NPT-type IGBT is provided with a structure that lowers the injection efficiency of the minority carriers and raises the transport efficiency thereof. By forming the reverse blocking IGBT to be an NPT-type one, the problems caused by the tradeoff relation between the ON-voltage characteristics and the turnoff loss are obviated and both the ON-voltage and the turnoff loss are reduced.

The following Patent Document 1 proposes a semiconductor device as the reverse blocking IGBT as described above. The proposed semiconductor device includes a semiconductor substrate; a p-type base region in the surface portion of the semiconductor substrate; an $n^+$ emitter region in the surface portion of the p-type base region; a $p^+$ collector region in the edge area of the semiconductor substrate and on the back surface side of the semiconductor substrate, the $p^+$ collector region surrounding the p-type base region. In other words, a $p^+$ region is on the side face of the semiconductor substrate and a $p^+$ collector region is on the back surface side of the semiconductor substrate. The $p^+$ collector region on the back surface side of the semiconductor substrate is around 1 μm in thickness.

The following Patent Document 2 proposes a high-voltage semiconductor device as described below that exhibits high forward and reverse withstand voltages. The high-voltage semiconductor device proposed in the following Patent Document 2 includes a semiconductor substrate including a drift layer, on both side of which pn-junctions for forward and reverse breakdown withstanding are formed, and a separation diffusion region working for the breakdown-withstanding junction edge-termination structure for the pn-junctions, the separation diffusion region being formed from the first major surface side of the semiconductor substrate. The drift layer includes a region, the impurity concentration distribution therein is substantially constant inward from the first major surface side or the impurity concentration therein reduces inward from the first major surface side.

FIG. 13(a) is the cross sectional view of another conventional reverse blocking IGBT.

The conventional reverse blocking IGBT shown in FIG. 13(a) includes n-type shell region 201 between drift region 1 and base region 2. Shell region 201 is doped more heavily than drift region 1. Between drift region 1 and collector region 10, n-type buffer region 202 is formed. Buffer region 202 is doped more heavily than drift region 1. The other structures are the same with the structures in the reverse blocking IGBT shown in FIG. 11.

The IGBT's having the structures as described below for improving the performances thereof are known to the persons skilled in the art.

The IGBT that includes a region, the conductivity type of which is the same with the conductivity type of the drift region. The region is doped more heavily than the drift region and disposed between the drift region and the base region or between the drift region and the collector region.

The IGBT that includes regions, the conductivity type of which is the same with the conductivity type of the drift region. The regions are doped more heavily than the drift region. One of the regions is disposed between the drift region and the base region. The other one of the regions is disposed between the drift region and the collector region.

The following Patent Document 3 proposes a semiconductor device as one of the IGBT's described above. The IGBT proposed in the Patent Document 3 includes four doped regions, the conductivity types of which are different from one another alternately. The doped regions are laid one on another. The dimensions of one of the doped regions (first base region) are determined with respect to punch-through. The proposed IGBT includes also two buffer layers. The conductivity type of the buffer layers is the same with the conductivity type of the first base region and the buffer layers are doped more heavily than the first base region for interrupting the IGBT symmetrically. The forward and reverse withstand voltages of the proposed IGBT are set to be almost the same.

The following Patent Document 4 proposes another semiconductor device (IGBT) as described below. The IGBT proposed in the Patent Document 4 includes a heavily doped region at least in a part of the boundary between a p-type base region and an n-type drift region. The conductivity type of the heavily doped region is the same with the conductivity type of the n-type drift region. The heavily doped region is doped more heavily than the n-type drift region. The structure described above shortens the channel length and reduces the voltage drop in the ON-state of the device.

The following Patent Document 5 proposes still another semiconductor device (IGBT) as described below. The IGBT proposed in the Patent Document 5 includes a short-lifetime region in the portion of an n-type base layer near to a p-type collector region. The short-lifetime region is an n-type one and doped more heavily than the n-type base layer. The short-lifetime region facilitates reducing the leakage current of the NPT-type IGBT.

The following documents describe related art.

1) Japanese Unexamined Patent Application Publication No. 2002-319676 (hereinafter referred to as "Patent Document 1").

2) Japanese Unexamined Patent Application Publication No. 2006-080269 (hereinafter referred to as "Patent Document 2").

3) Japanese Unexamined Patent Application Publication (Translation of PCT Application) No. 2002-532885 (hereinafter referred to as "Patent Document 3").

4) Japanese Unexamined Patent Application Publication No. Hei. 9 (1997)-326486 (hereinafter referred to as "Patent Document 4").

5) Japanese Unexamined Patent Application Publication No. Hei. 9 (1997)-260662 (hereinafter referred to as "Patent Document 5").

According the technique disclosed in the Patent Document 1, the reverse withstand voltage is lower than the forward withstand voltage. Generally, the NPT-type IGBT includes a $p^+$-type body region in a base region for preventing latch-up breakdown from causing during the forward bias voltage application or during the turnoff of the device. The body region is doped much more heavily than the base region. The base region is doped more heavily than the drift region.

For reducing the turnoff loss, the collector region is doped more heavily than the drift region. The collector region is doped much more lightly than the body region. Due to the impurity concentration scheme, the depletion layer expanding from the collector region during the reverse bias voltage application is larger than the depletion layer expanding from the base region during the forward bias voltage application.

The width in the substrate depth direction of the base region not depleted (hereinafter referred to as the "neutral base region width") during the reverse bias voltage application is the distance from the upper edge of the depletion layer expanding from the collector region to the base region. If described more in detail, the neutral base region width during the reverse bias voltage application is shorter than the neutral base region width during the forward bias voltage application, that is the distance from the lower edge of the depletion layer expanding from the base region to the collector region.

Due to the neutral base region width difference, the transport efficiency is larger during the reverse bias voltage application than during the forward bias voltage application. Therefore, the carrier amplification factor becomes much higher during the reverse bias voltage application than during the forward bias voltage application. Therefore, the reverse leakage current increases in association with the rise of the carrier amplification factor and the reverse withstand voltage lowers.

The technique disclosed in the Patent Document 3 causes the problems as described below. The relation between the height y from the substrate bottom plane and the electric field E is described in FIG. 13(b). Now the descriptions will be made with reference to FIGS. 13(a) and 13(b).

In the reverse blocking IGBT shown in FIG. 13(a), the electric field in the semiconductor substrate becomes high rapidly due to the disposition of shell region 201 and buffer region 202. During the forward bias voltage application for example (compare the solid lines in FIG. 13(b)), the electric field becomes high rapidly in region 211 in the vicinity of the boundary between base region 2 and shell region 201. During the reverse bias voltage application (cf. the broken lines in FIG. 13(b)), the electric field becomes high rapidly in region 212 in the vicinity of the boundary between collector region 10 and buffer region 202. Due to the rapid rise of the electric field, the forward and reverse withstand voltages lower in many cases. In other words, the forward and reverse withstand voltages to be obtained by the disposition of shell region 201 and buffer region 202 may not be realized actually.

It is known to the persons skilled in the art that the problems described above may be obviated by lowering the impurity concentration in the drift region. However, as the impurity concentration in the drift region is lowered, the depletion layer reaches buffer region 202 while the semiconductor device is operating, causing a reach-through phenomenon. Due to the reach-through phenomenon caused, oscillations are caused on the turnoff voltage waveform and the turnoff current waveform (hereinafter referred to collectively as the "turnoff waveforms").

The reverse blocking IGBT exhibits the characteristics (reverse recovery characteristics) that make a high transient current flow when the reverse blocking IGBT is switched from the ON-state thereof to the reverse blocking state. Due to the reverse recovery characteristics, the reverse recovery voltage waveform and the reverse recovery current waveform (hereinafter referred to collectively as the "reverse recovery waveforms") are liable to oscillations. In the case, in which the turnoff waveforms and the reverse recovery waveforms oscillate, the semiconductor device may be broken down, when noises are caused or when very large oscillations are caused on the voltage waveform.

In view of the foregoing, it is a first object of embodiments of the invention to obviate the problems described above. It is a second object of embodiments of the invention to provide a semiconductor device that facilitates improving the forward withstand voltage thereof. It is a third object of embodiments of the invention to provide a semiconductor device that facilitates improving the reverse withstand voltage thereof. It is a fourth object of embodiments of the invention to provide a semiconductor device that facilitates removing oscillations from the turnoff waveforms. It is a fifth object of embodiment of the invention to provide a semiconductor device that facilitates suppressing the oscillations on the reverse recovery waveforms.

SUMMARY OF THE INVENTION

According to the subject matter of an embodiment of the invention, there is provided a semiconductor device including:

a first semiconductor region of a first conductivity type;

a second semiconductor region of a second conductivity type formed selectively in the surface portion of the first semiconductor region;

a third semiconductor region of the first conductivity type formed selectively in the surface portion of the second semiconductor region;

a first electrode crossing over the first semiconductor region from the third semiconductor region with an insulator film interposed between the first electrode and the first semiconductor region;

a second electrode connected to the second semiconductor region and the third semiconductor region;

a fourth semiconductor region of the first conductivity type between the first semiconductor region and the second semiconductor region, the fourth semiconductor region occupying at least a region below the second semiconductor region;

a fifth semiconductor region of the second conductivity type on the back surface of the first semiconductor region;

a third electrode in contact with the fifth semiconductor region;

the fourth semiconductor region being doped more heavily than the first semiconductor region, the fourth semiconductor region containing an impurity of the first conductivity type at the average impurity amount of $8.0 \times 10^{11}$ cm-2 or smaller; and the first semiconductor region exhibiting the resistivity low enough to prevent the depletion layer expanding from the fifth semiconductor region from reaching the fourth semiconductor region.

According to the subject matter of an embodiment of the invention, the fourth semiconductor region surrounds the entire region below the second semiconductor region.

According to the subject matter of an embodiment of the invention, average impurity amount of the impurity of the first conductivity type in the fourth semiconductor region is $5.0 \times 10^{11}$ cm$^{-2}$ or smaller.

According to the subject matter of an embodiment of the invention, the average impurity amount of the impurity of the first conductivity type in the fourth semiconductor region is $1.0 \times 10^{11}$ cm$^{-2}$ or smaller.

According to the subject matter of an embodiment of the invention, the semiconductor device further includes a sixth semiconductor region of the second conductivity type in the edge area of the first semiconductor region, the sixth semiconductor region extending through the first semiconductor region from the front surface thereof to the back surface thereof, and the sixth semiconductor region being in contact with the fifth semiconductor region.

According to the subject matter of an embodiment of the invention, the semiconductor device further includes a breakdown withstanding region between an active region, therein the second semiconductor region, the third semiconductor region and the fourth semiconductor region are formed, and the sixth semiconductor region, the breakdown withstanding region surrounding the active region; and a seventh semiconductor region of the second conductivity type in the surface portion of the first semiconductor region in the breakdown withstanding region, a plurality of the seventh semiconductor region surrounding the active region.

According to the subject matter of an embodiment of the invention, the first semiconductor region exhibits the resistivity low enough to prevent the depletion layer expanding, when a reverse voltage equal to the rated voltage is applied, from the fifth semiconductor region toward the fourth semiconductor region from reaching the fourth semiconductor region.

According to the subject matter of an embodiment of the invention, the semiconductor device further includes an eighth semiconductor region of the first conductivity type between the first semiconductor region and the fifth semiconductor region, and the first semiconductor region exhibits the resistivity low enough to prevent the space charge region expanding from the second semiconductor region from reaching the eighth semiconductor region.

According to the subject matter of an embodiment of the invention, the average amount of an impurity of the first conductivity type in the eighth semiconductor region is $1.0 \times 10^{12}$ cm$^{-2}$ or smaller.

The semiconductor device according to the invention includes the fourth semiconductor region between the first semiconductor region and the second semiconductor region. The fourth semiconductor region contains an impurity of the first conductivity type at the average impurity amount of $8.0 \times 1011$ cm-2 or smaller. The first semiconductor region exhibits the resistivity low enough to prevent the depletion layer expanding from the fifth semiconductor region from reaching the fourth semiconductor region.

Due to the configurations described above, the semiconductor device according to the invention relaxes the electric field in the semiconductor substrate more effectively than the conventional reverse blocking IGBT. Due to the disposition of the fourth semiconductor region and the first semiconductor region, any reach-through phenomenon is not caused.

Due to the disposition of the first semiconductor region exhibiting the resistivity as described above, the depletion layer never reaches the fourth semiconductor region during the reverse recovery.

The semiconductor device according to the invention facilitates improving the reverse withstand voltage thereof. The semiconductor device according to the invention facilitates improving also the forward withstand voltage thereof. The semiconductor device according to the invention facilitates preventing the turnoff voltage waveform and the turnoff current waveform from oscillating. The semiconductor device according to the invention facilitates suppressing the oscillations caused on the reverse recovery voltage waveform and the reverse recovery current waveform.

BRIEF DESCRIPTIONS OF THE DRAWINGS

Figure 2:
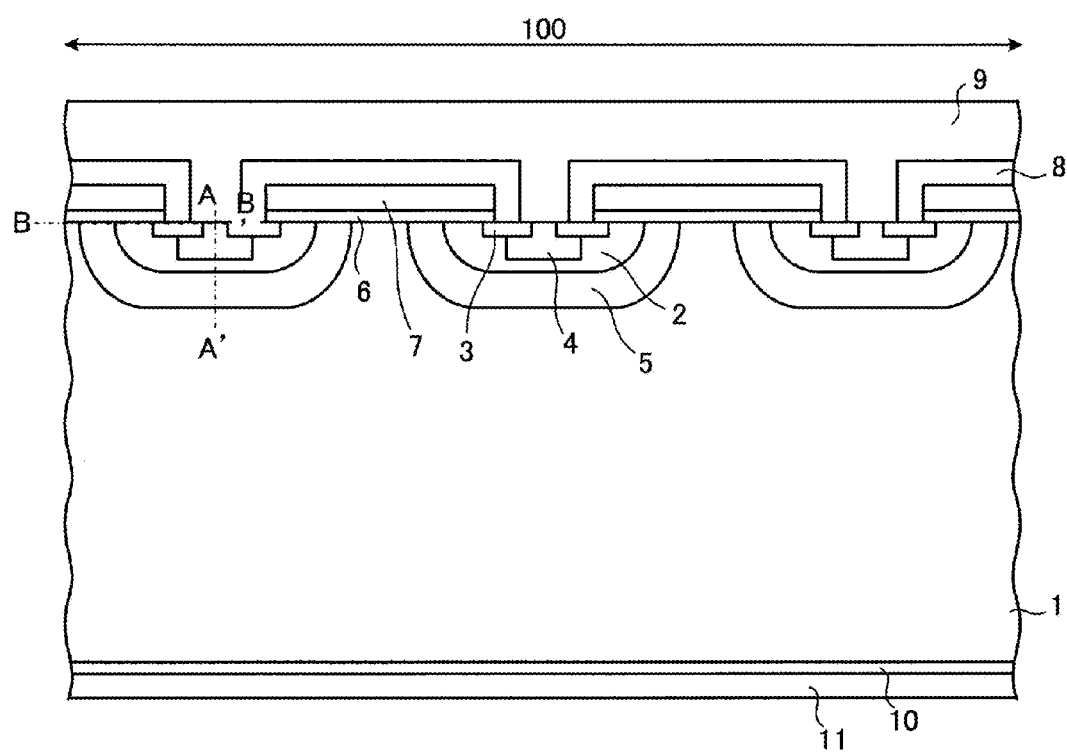
FIG. 2 is a cross sectional view showing the active region in the semiconductor device shown in FIG. 1 in detail.
Figure 5:
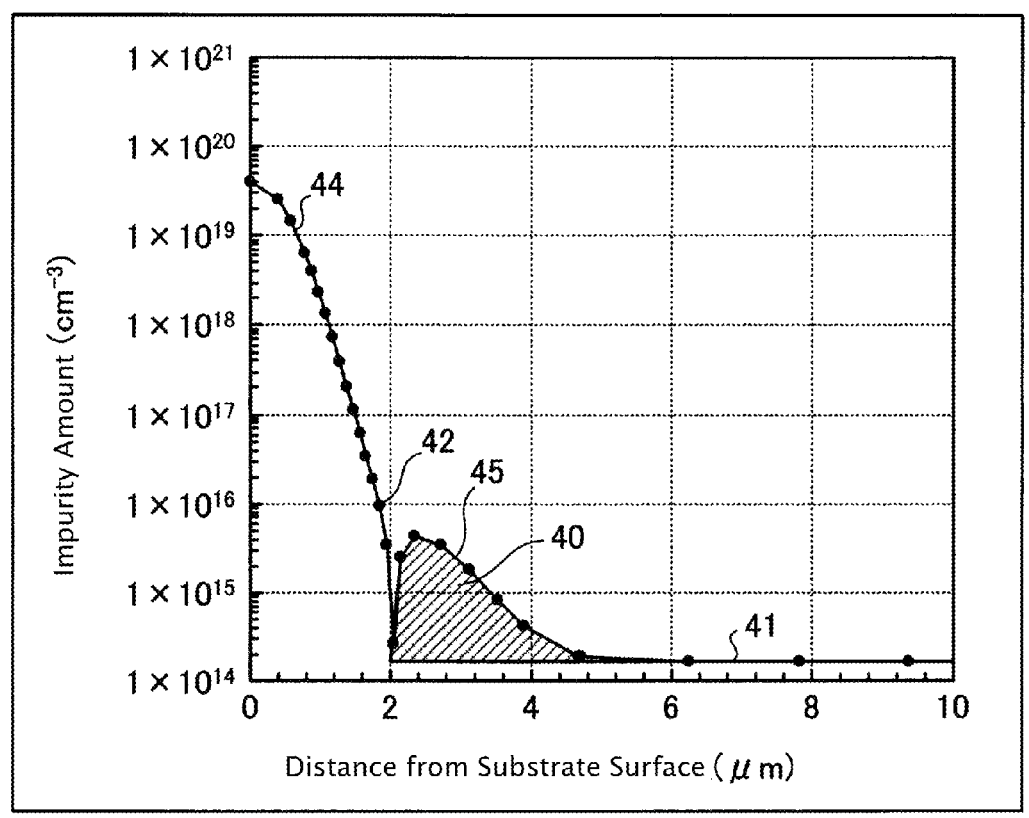

FIG. 5 describes a curve describing the impurity amount distribution along the line segment A-A' in FIG. 2.

Figure 6:
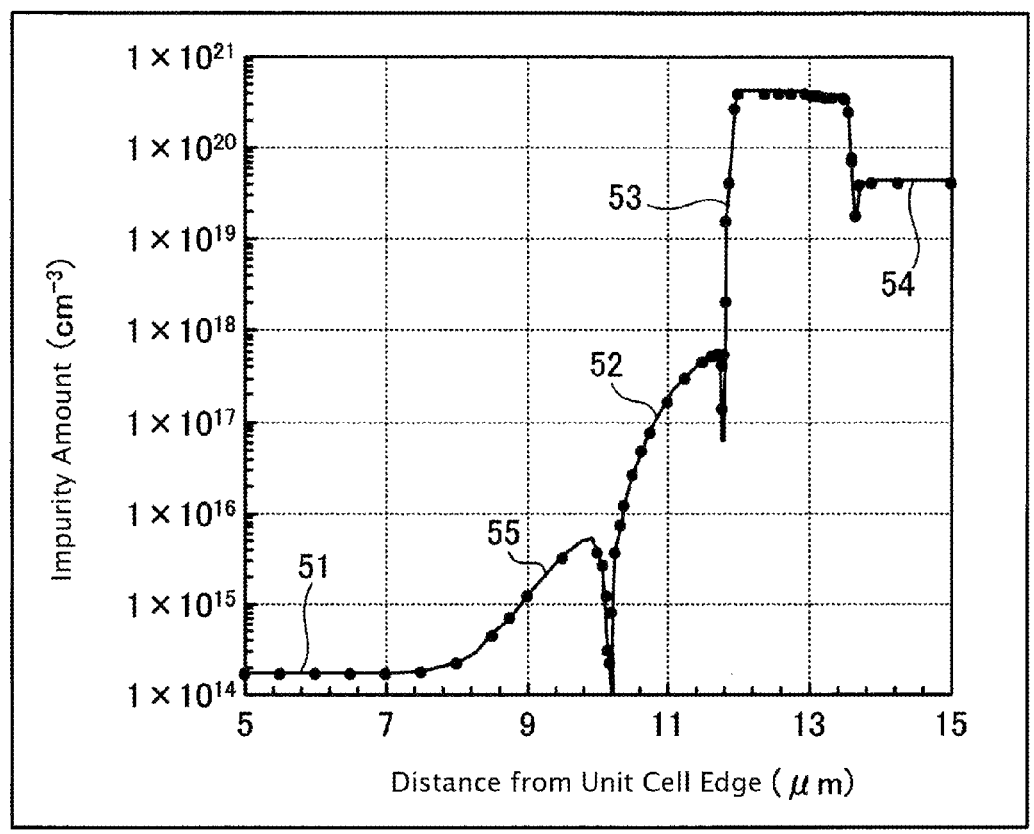

FIG. 6 describes a curve describing the impurity amount distribution along the line segment B-B' in FIG. 2.

Figure 7:
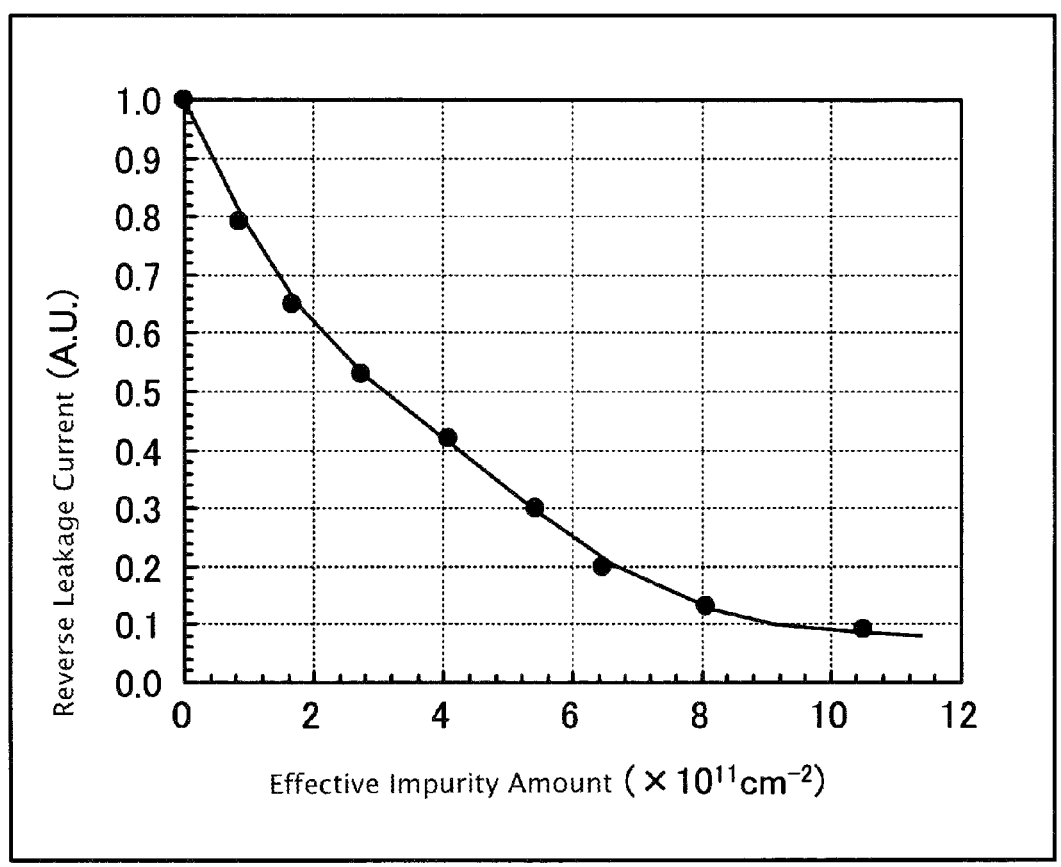

FIG. 7 describes a curve relating the reverse leakage current with the effective impurity amount in shell region 5.

Figure 8:
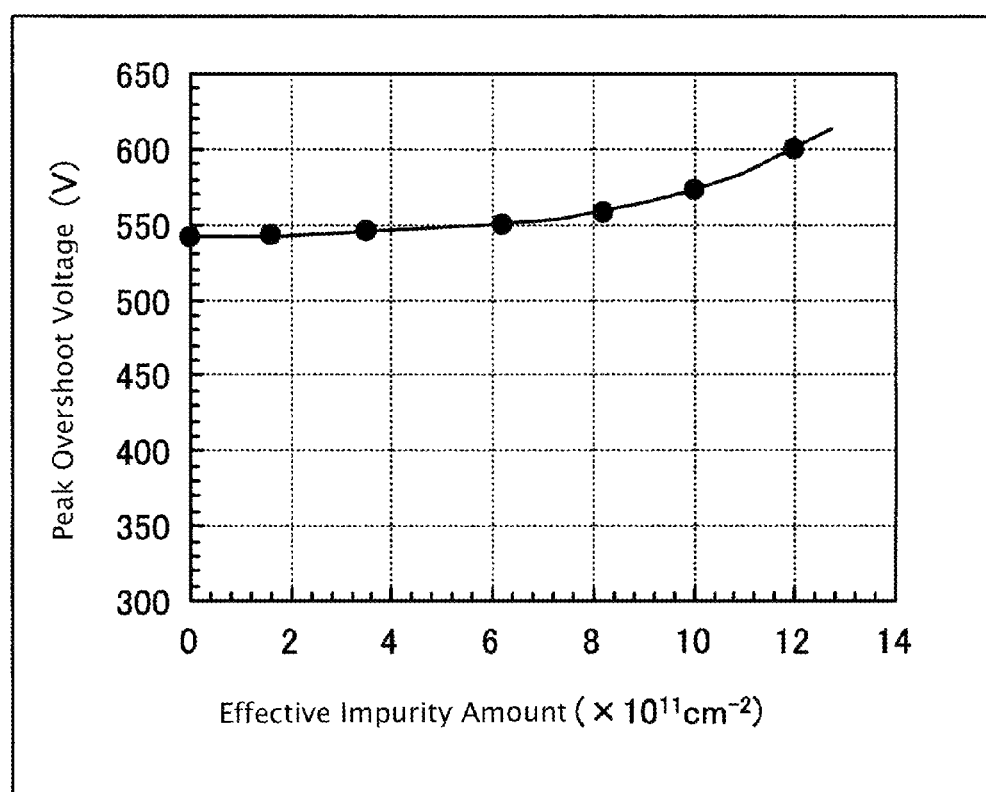

FIG. 8 describes a curve relating the peak overshoot voltage caused during the reverse recovery with the effective impurity amount in shell region 5.

Figure 9:
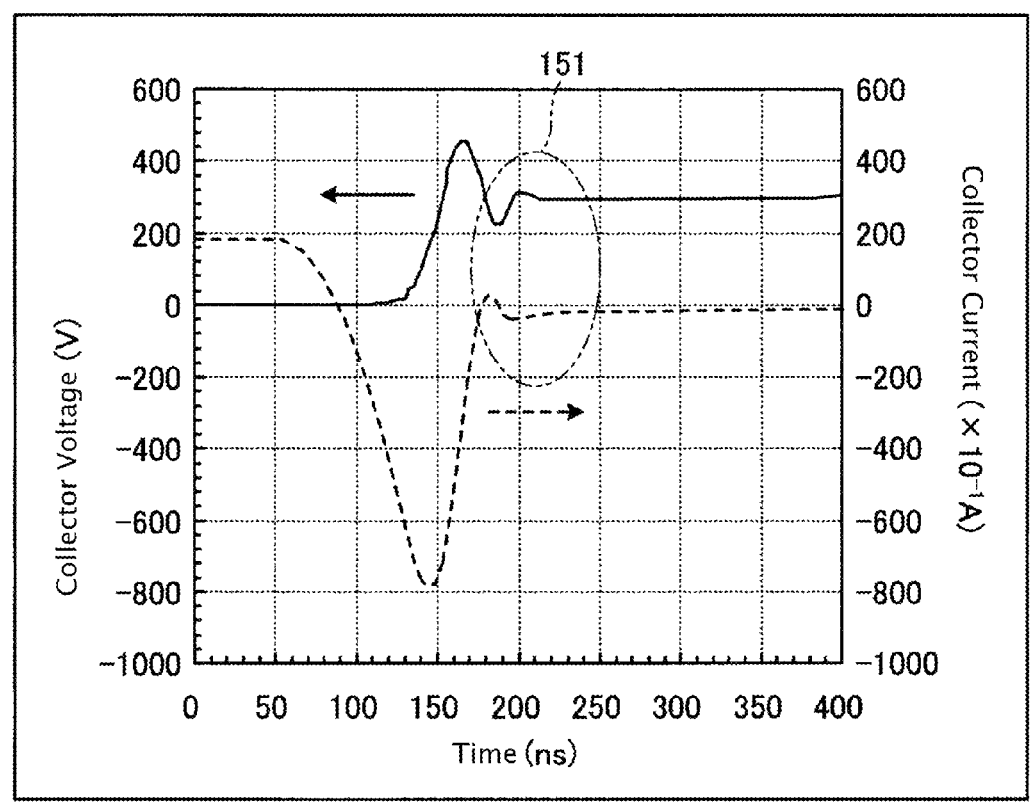

FIG. 9 is a wave chart describing the reverse recovery voltage waveform and the reverse recovery current waveform in the reverse blocking IGBT according to the invention.

Figure 10:
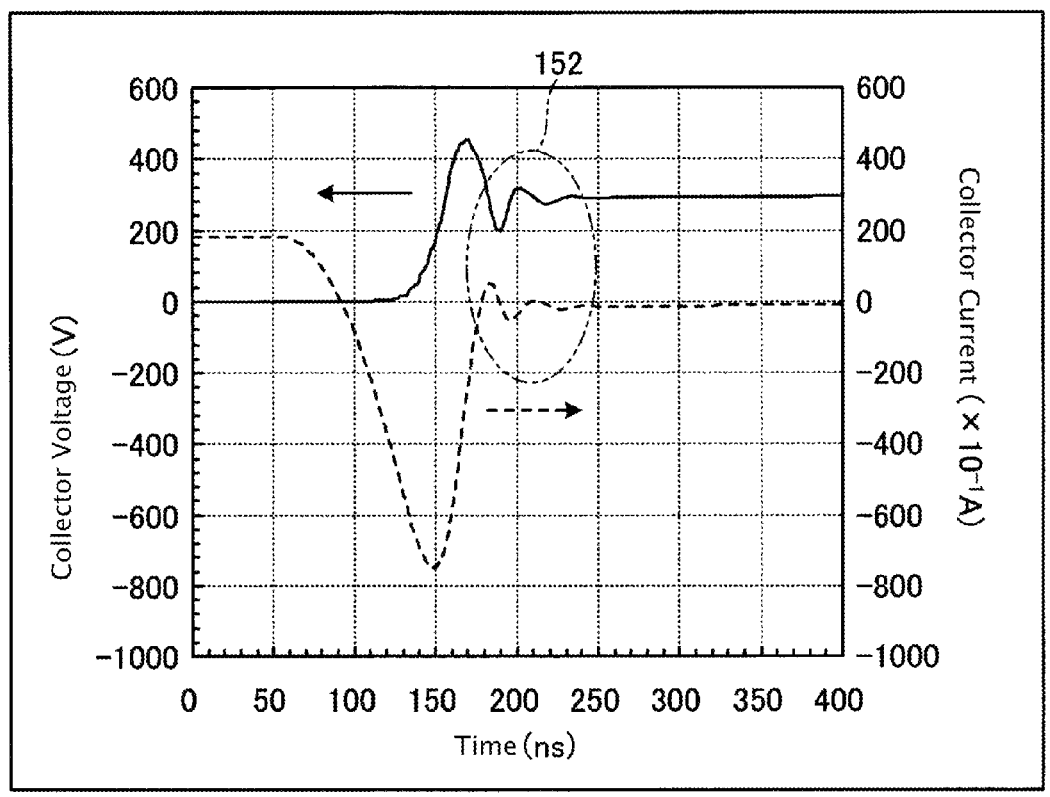

FIG. 10 is a wave chart describing the reverse recovery voltage waveform and the reverse recovery current waveform in the conventional reverse blocking IGBT.

Figure 11:
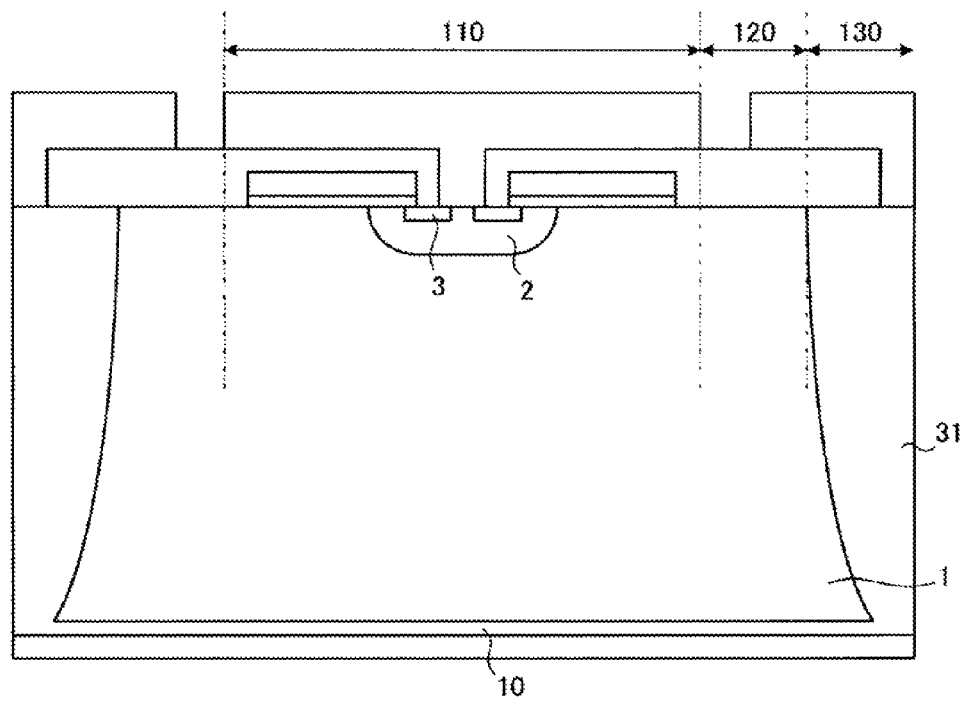

FIG. 11 is the cross sectional view of the conventional reverse blocking IGBT.

Figure 12:
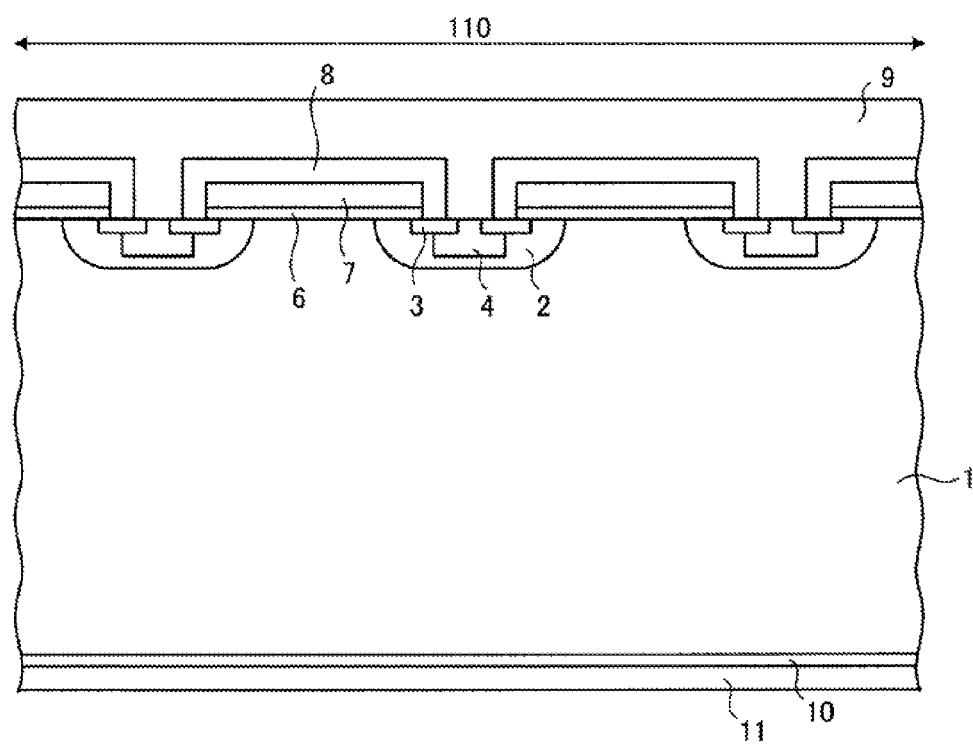

FIG. 12 is a cross sectional view showing the active region in the semiconductor device shown in FIG. 11 in detail.

Figure 13A:
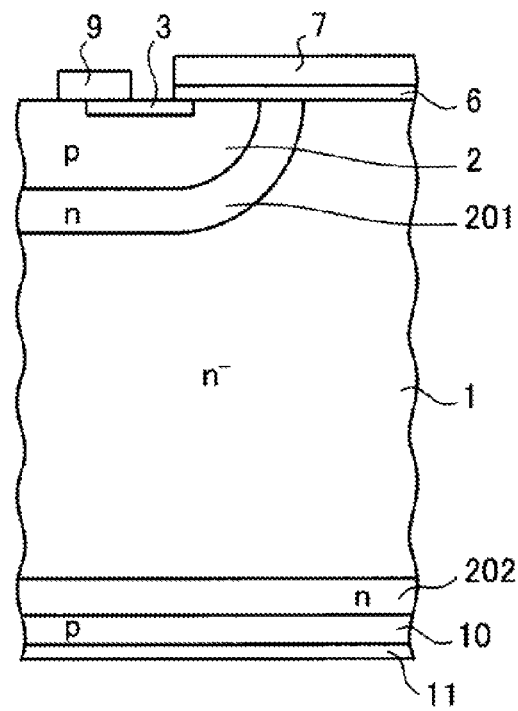

FIG. 13(a) is the cross sectional view of the other conventional reverse blocking IGBT.

Figure 13B:
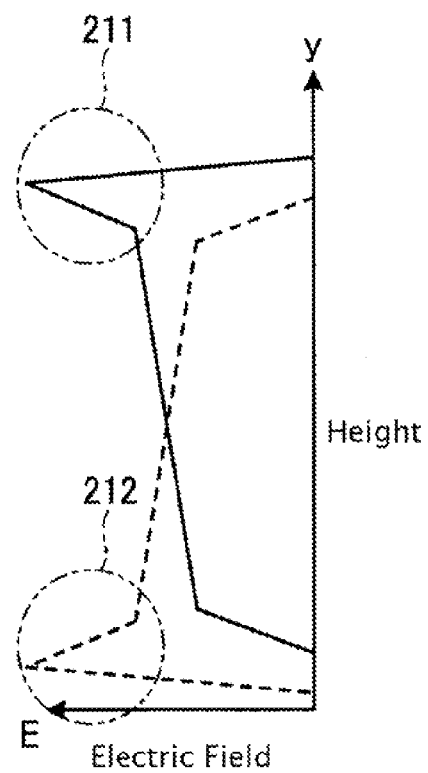

FIG. 13(b) is an electric field distribution diagram describing the relations between the height y from the substrate bottom plane and the electric field E in the conventional reverse blocking IGBT shown in FIG. 13(a).

FIG. 14(a) is a cross sectional view showing a part of the active region in the reverse blocking IGBT according to a second embodiment of the invention.

FIG. 14(b) is an electric field distribution diagram describing the relations between the height y from the substrate bottom plane and the electric field E in the part of the active region shown in FIG. 14(a).

FIG. 15 relates the turnoff loss with the ON-state voltage for the reverse blocking IGBT according to the second embodiment and for the conventional reverse blocking IGBT.

DETAILED DESCRIPTION OF CERTAIN EMBODIMENTS

Now the invention will be described in detail below with reference to the accompanied drawings which illustrate the preferred embodiments of the invention. In the following descriptions and the drawings which illustrate the preferred embodiments, the same reference numerals as used in FIGS. 11 through 13(b) are used to designate the same constituent elements and their duplicated descriptions are not made for the sake of simplicity.

Figure 1:
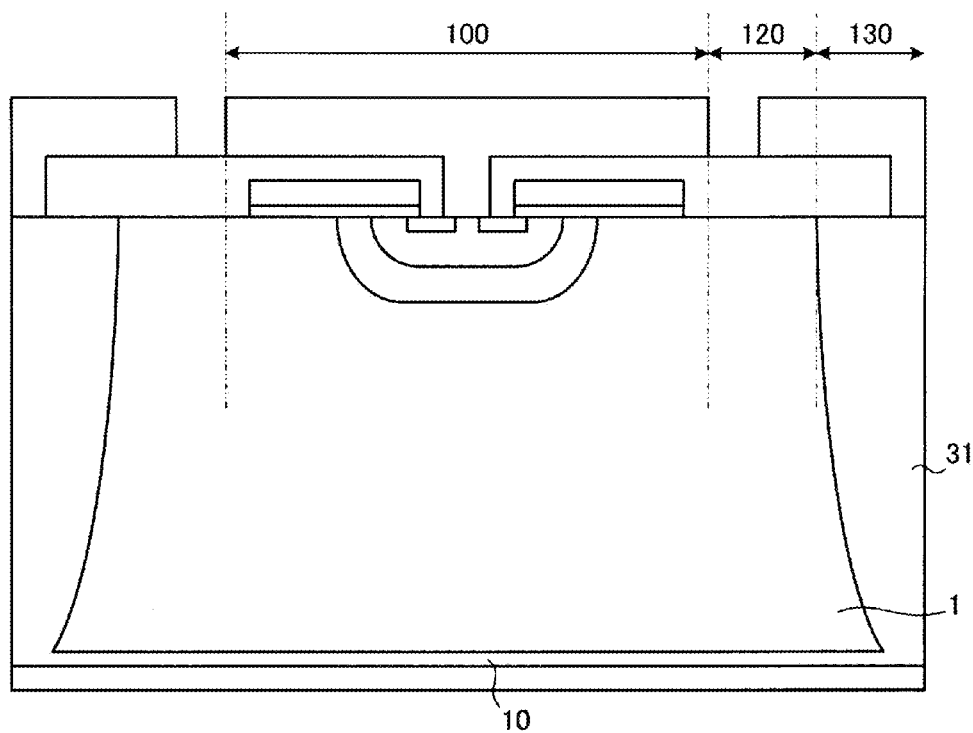
FIG. 1 is the cross sectional view of a reverse blocking IGBT according to a first embodiment of the invention.

FIG. 1 is the cross sectional view of a reverse blocking IGBT according to a first embodiment of the invention.

Referring now to FIG. 1, the reverse blocking IGBT according to the invention includes a semiconductor substrate working for n⁻-type (first conductivity type) drift region 1; active region 100 in the semiconductor substrate; breakdown withstanding region 120 outside active region 100; and separation section 130 outside breakdown withstanding region 120. It is effective for the semiconductor substrate to be 90 µm in thickness or thicker so as not to adversely affect the performances of the reverse blocking IGBT of the 600 V breakdown voltage class. In active region 100, a vertical IGBT structure is formed. The vertical IGBT structure includes an emitter-gate region formed on the front surface side of drift region 1 and p-type (second conductivity type) collector region 10 on the back surface side of drift region 1. Active region 100 will be described later in detail.

Drift region 1 corresponds to a first semiconductor region. Collector region 10 corresponds to a fifth semiconductor region.

Breakdown withstanding region 120 is between active region 100 and separation section 130 and surrounding active region 100. Breakdown withstanding region 120 relaxes the electric field strength on the pn-junction constituting the semiconductor device to realize the desired withstand voltages. Breakdown withstanding region 120 will be described later in detail.

Separation section 130 is formed in the edge area of the semiconductor substrate and surrounding active region 100. Separation section 130 isolates active region 100 from the crystal defects caused in the side face of the semiconductor substrate in dicing a semiconductor wafer into chips. In separation section 130, p-type separation region 31 is formed. Separation region 31 is formed through the edge area of drift region 1 from the front surface thereof to the back surface thereof. Separation region 31 is in contact with collector region 10 formed on the back surface of active region 100. When a reverse voltage is applied, a depletion layer extends along separation region 31 from collector region 10 on the back surface of the semiconductor substrate due to the disposition of separation region 31. Therefore, the depletion layer is prevented from reaching active region 100 in the semiconductor substrate and a leakage current is prevented from causing. Thus, the reverse blocking IGBT obtains a reverse withstand voltage.

Separation region 31 corresponds to a sixth semiconductor region.

FIG. 2 is a cross sectional view showing the active region in the semiconductor device shown in FIG. 1 in detail.

Active region 100 includes p-type base region 2 formed selectively in the surface portion of the semiconductor substrate working as n⁻-type drift region 1. Base region 2 is doped more heavily than drift region 1. In the surface portion of base region 2, n⁺-type emitter region 3 and p⁺-type body region 4 are formed selectively. Body region 4 occupies a part of the region below emitter region 3. Body region 4 is doped more heavily than base region 2.

Base region 2 corresponds to a second semiconductor region. Emitter region 3 corresponds to a third semiconductor region.

Between drift region 1 and base region 2, n-type shell region 5 is formed. It is preferable for shell region 5 to occupy at least a region below base region 2. In other words, it is preferable to form shell region 5 such that shell region 5 occupies a part of base region 2 nearest to the depletion layer expanding from collector region 10. Shell region 5, that occupies a part of base region 2 nearest to the depletion layer expanding from collector region 10, facilitates suppressing the minority carrier injection from collector region 10 to base region 2 and reducing the transport efficiency of the minority carriers.

It is more preferable to form shell region 5 such that shell region 5 surrounds the entire region below base region 2. Since any region, in which base region 2 and drift region 1 is in contact with each other, is not formed at all, the minority carrier injection from collector region 10 to base region 2 is suppressed securely and the transport efficiency is reduced securely.

Shell region 5 is doped more heavily than drift region 1. Drift region 1 exhibits the resistivity low enough to prevent the depletion layer expanding from collector region 10 to shell region 5 from reaching shell region 5. It is preferable for drift region 1 to exhibit the resistivity low enough to prevent the depletion layer expanding from collector region 10 toward shell region 5, when a reverse voltage equal to the rated voltage is applied, from reaching shell region 5.

For securing the withstand voltages for the reverse blocking IGBT, the rated voltage thereof is 600 V, it is preferable for the drift region 1 resistivity to be 22 Ωcm or higher. It is also preferable for the drift region 1 resistivity to be 35 Ωcm or lower in the reverse blocking IGBT, the rated voltage thereof is 600 V. By setting the drift region 1 resistivity as described above, the depletion layer is made not to reach shell region 5 during the reverse recovery.

Shell region 5 is doped such that the average n-type impurity amount therein (hereinafter referred to as the "effective impurity amount in shell region 5") is $8.0 \times 10^{11}$ cm$^{-2}$ or lower. Even if the impurity amount distribution in shell region 5 is not uniform, no problem will be caused as far as the n-type impurity amount in shell region 5 is set to be $8.0 \times 10^{11}$ cm$^{-2}$ or lower in average independently of the impurity concentration distribution therein.

It is preferable to set the effective impurity amount in shell region 5 to be $5.0 \times 10^{11}$ cm$^{-2}$ or lower, since the increasing magnitude of the peak overshoot voltage caused during the reverse recovery is suppressed more effectively than in the reverse blocking IGBT not including any shell region. The reason for this will be described later in detail.

It is also preferable to set the effective impurity amount in shell region 5 to be $1.0 \times 10^{11}$ cm$^{-2}$ or lower, since the reverse recovery voltage waveform and the reverse recovery current waveform (hereinafter referred to collectively as the "reverse recovery waveforms") may recover more quickly than those in the reverse blocking IGBT not including any shell region. The reason for this will be described later in detail.

Shell region 5 may be doped at any of the effective impurity amounts described above with no problem independently of the impurity concentration distribution therein. The effective impurity amount in shell region 5 will be described later in detail.

Shell region 5 corresponds to a fourth semiconductor region.

Above the semiconductor substrate surface, gate electrode 7 is formed with gate insulator film 6 interposed between the semiconductor substrate surface and gate electrode 7 such that gate electrode 7 is crossing over drift region 1 from emitter region 3. Emitter electrode 9 is in contact with emitter region 3. Emitter electrode 9 is connected electrically to base region 2 via body region 4. Emitter electrode 9 is insulated electrically from gate electrode 7 by interlayer insulator film 8. On the back surface of drift region 1, p-type collector region 10 is formed as described earlier. Collector electrode 11 is in contact with collector region 10.

Gate insulator film 6 corresponds to an insulator film. Gate electrode 7 corresponds to a first electrode. Emitter electrode 9 corresponds to a second electrode. Collector electrode 11 corresponds to a third electrode.

Figure 3:
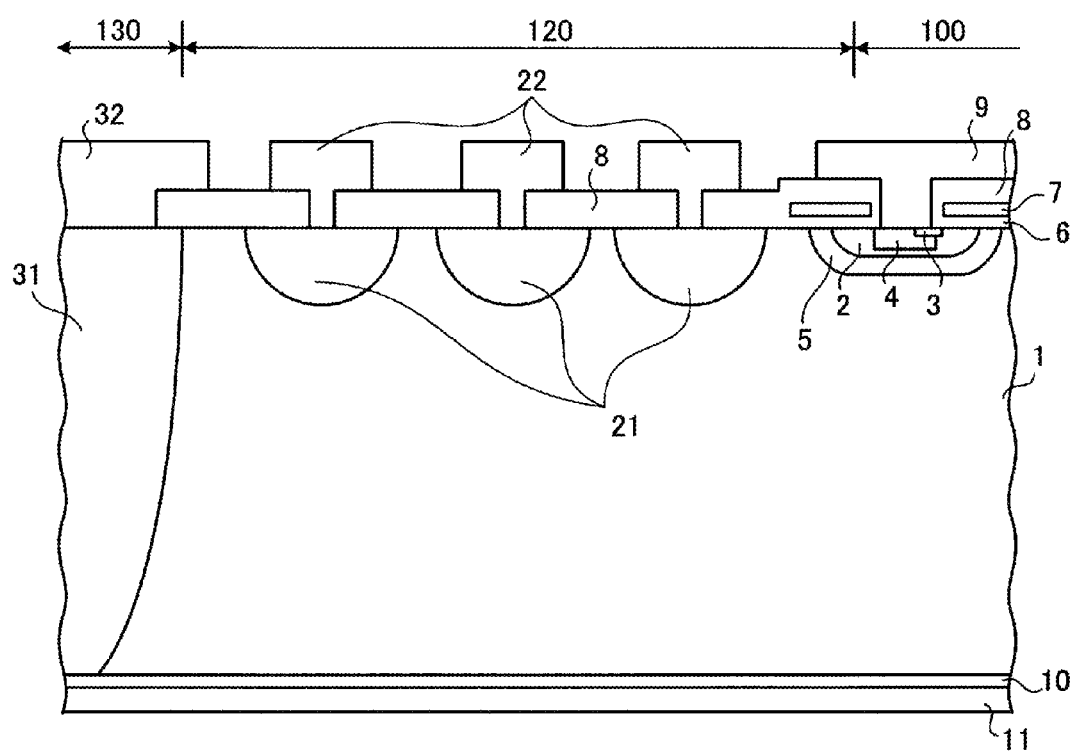
FIG. 3 is a cross sectional view showing the breakdown withstanding region in the semiconductor device shown in FIG. 1 in detail.

FIG. 3 is a cross sectional view showing breakdown withstanding region 120 in the semiconductor device shown in FIG. 1 in detail.

In breakdown withstanding region 120, a plurality of field limiting rings (hereinafter referred to as "FLR's") 21, which are floating p-type regions, is formed on the drift region 1 surface. FLR's 21 surround active region 100. The drift region 1 front surface, under which any FLR 21 is not, is covered with interlayer insulator film 8.

On interlayer insulator film 8, field plate (hereinafter referred to as "FP") 22, that is a floating electrically conductive film, is formed. FP 22 is in contact with FLR 21. From breakdown withstanding region 120 to separation section 130, field plate 32, the potential thereof is the same with potential of separation region 31, is formed. Hereinafter field plate 32 will be referred to as "equipotential FP 32". Equipotential FP 32 is in contact with and connected electrically to separation region 31.

FLR 21 corresponds to a seventh semiconductor region.

Figure 4A:
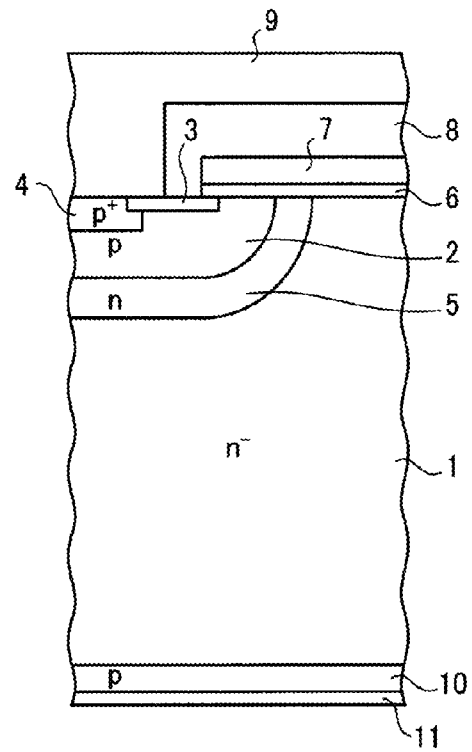
FIG. 4(a) is a cross sectional view showing a part of the active region in the reverse blocking IGBT according to the first embodiment of the invention.
Figure 4B:
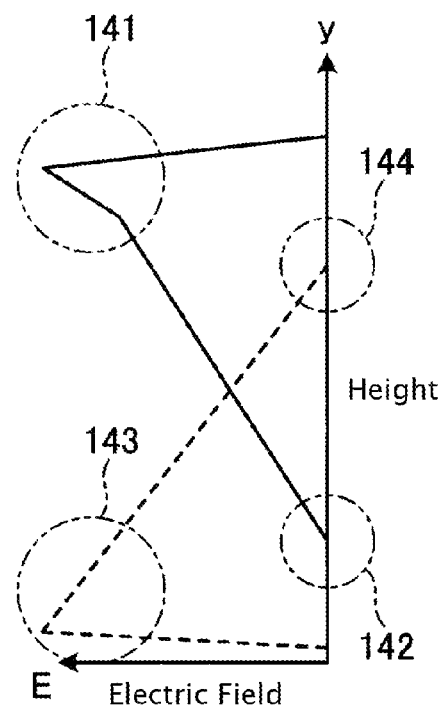
FIG. 4(b) is an electric field distribution diagram describing the relations between the height y from the substrate bottom plane and the electric field E in the part of the active region shown in FIG. 4(a).

FIG. 4(a) is a cross sectional view showing a part of active region 100 in the reverse blocking IGBT shown in FIG. 2. FIG. 4(b) is an electric field distribution diagram describing the relation between the height y from the substrate bottom plane and the electric field E in the part of active region 100 shown in FIG. 4(a).

The reverse blocking IGBT shown in FIG. 2 facilitates making the electric field rise in region 141 in the vicinity of the boundary between base region 2 and shell region 5 slower than in the conventional reverse blocking IGBT during the forward bias voltage application (cf. the solid lines in FIG. 4(b)). The reverse blocking IGBT shown in FIG. 2 also facilitates preventing the electric field from extending from region 142 in the vicinity of collector region 10 to the substrate back surface.

During the reverse bias voltage application (cf. the broken lines in FIG. 4(b)), it is possible to smoothen the electric field rise in region 143 in the vicinity of the boundary between drift region 1 and collector region 10. It is also possible to prevent the electric field from extending from region 144 in the vicinity of shell region 5 to the substrate front surface. The favorable results described above are obtained, since shell region 5 and drift region 1 are formed under the conditions described above.

The current characteristics of the reverse blocking IGBT according to the invention are investigated as described below.

A reverse blocking IGBT according to the invention (hereinafter referred to simply as an "example IGBT") is prepared. The rated voltage of the example IGBT is set to be 600 V. The semiconductor substrate resistivity and the semiconductor substrate thickness in the example IGBT are set to be 28 Ωcm and 100 μm, respectively. In other words, the drift region 1 resistivity is set to be 28 Ωcm. In FIGS. 5 through 10, similar example IGBT's are used.

FIG. 5 describes a curve describing the impurity amount distribution along the line segment A-A' in FIG. 2. FIG. 6 describes another curve describing the impurity amount distribution along the line segment B-B' in FIG. 2.

The impurity amount in the semiconductor substrate in the example IGBT is measured. And, the effective impurity amount in shell region 5 is calculated. FIG. 5 describes the average impurity amount per unit volume in a region positioned at a certain depth from the semiconductor substrate surface. FIG. 6 describes the average impurity amount per unit volume in a region positioned at a certain distance in the direction from drift region 1 (unit cell edge) toward body region 4.

First measurement result 44 in FIG. 5 indicates the impurity amount distribution in body region 4. Second measurement result 42 in FIG. 5 indicates the impurity amount distribution in base region 2. Third measurement result 45 in FIG. 5 indicates the impurity amount distribution in shell region 5. Fourth measurement result 41 in FIG. 5 indicates the impurity amount distribution in drift region 1.

Fifth measurement result 51 in FIG. 6 indicates the impurity amount distribution in drift region 1. Sixth measurement result 55 in FIG. 6 indicates the impurity amount distribution in shell region 5. Seventh measurement result 52 in FIG. 6 indicates the impurity amount distribution in base region 2. Eighth measurement result 53 in FIG. 6 indicates the impurity amount distribution in emitter region 3. Ninth measurement result 54 in FIG. 6 indicates the impurity amount distribution in body region 4.

The effective impurity amount in shell region 5 is calculated by integrating the impurity amount at every depth of third measurement result 45. The impurity amount distributions described in FIG. 5 indicate the impurity amounts of the electrically conductive impurities distributing in the depth direction. Third measurement result 45 in FIG. 5 indicates that the impurity amount is larger in the region near to the substrate surface and becomes smaller in the region positioned deeper from the substrate surface. Therefore, the average impurity amount per unit area in shell region 5 is calculated by integrating the impurity amount at every depth of third measurement result 45. In other words, even when the impurity amount distribution in shell region 5 is not uniform as described in FIG. 5, the impurity concentration in entire shell region 5 can be calculated.

The effective impurity amount in shell region 5 is determined by subtracting the average impurity amount per unit area in drift region 1 from the average impurity amount per unit area in shell region 5 calculated as described above. In other words, region 40 (the hatched area in FIG. 5) in the impurity distribution pattern of third measurement result 45 indicates the effective impurity amount in shell region 5. Here, the average impurity amount per unit area in drift region 1 is the average impurity amount per unit area in the drift region 1 portion, in which shell region 5 is formed. The average impurity amount per unit area in drift region 1 is calculated in the similar manner as the average impurity amount per unit area in shell region 5.

FIG. 7 describes a curve relating the reverse leakage current with the effective impurity amount in shell region 5. Example IGBT's, in which the effective impurity amount in shell region 5 is changed variously, are prepared. The effective impurity amount in shell region 5 is set to be from $2 \times 10^{11}$ cm$^{-2}$ to $1.2 \times 10^{12}$ cm$^{-2}$. The reverse leakage currents caused in the respective example IGBT's are measured. For the sake of comparison, a reverse blocking IGBT not including any shell region (hereinafter referred to simply as a "comparative IGBT") is prepared. The reverse leakage current caused in the comparative IGBT is measured. In FIG. 7, the reverse leakage current of the comparative IGBT is described at the zero effective impurity amount.

The results described in FIG. 7 indicate that the reverse leakage current is reduced by disposing shell region 5. The results described in FIG. 7 indicate also that as the effective impurity amount in shell region 5 is larger, the reverse leakage current is reduced more effectively. Due to the disposition of shell region 5 between drift region 1 and base region 2, the current amplification factor of the pnp transistor formed of collector region 10, drift region 1 and base region 2 (body region 4) is made to be small.

FIG. 8 describes a curve relating the peak overshoot voltage with the effective impurity amount in shell region 5. The peak overshoot voltages caused during the reverse recovery in the respective example IGBT's used in FIG. 7 are measured. The peak overshoot voltage caused during the reverse recovery in the comparative IGBT is measured. In FIG. 8, the peak overshoot voltage of the comparative IGBT is described at the zero effective impurity amount. In FIG. 8, the bus voltage is set at 300 V and the peak overshoot voltages caused at the reverse recovery current of 180 A/cm$^2$ are measured.

The results described in FIG. 8 indicate that the disposition of shell region 5 makes the peak overshoot voltage high. The results described in FIG. 8 indicate also that the peak overshoot voltage becomes higher as the effective impurity amount in shell region 5 is larger. The results described in FIG. 8 also indicate that the increment of the peak overshoot voltage becomes higher in association with the increasing effective impurity amount in shell region 5. It is estimated that as the effective impurity amount in shell region 5 is larger, the turn-on switching speed of the reverse blocking IGBT becomes faster, increasing the reverse recovery current. It is desirable for the peak overshoot voltage to be low in the semiconductor device used as a switching device, since noises are more liable to be caused as the peak overshoot voltage is higher. Therefore, it is desirable to set the effective impurity amount in shell region 5 to be small.

As the results described in FIG. 8 indicate, the peak overshoot voltage is around 560 V at the effective impurity amount in shell region 5 of $8.0 \times 10^{11}$ cm$^{-2}$. The peak overshoot voltage in the comparative IGBT is 540 V. If compared with the comparative IGBT, the increasing rate of the peak overshoot voltage in the example IGBT is suppressed to be 10% or lower.

Here, ([The increasing rate of the peak overshoot voltage in the example IGBT]≈[The peak overshoot voltage 560 V in the example IGBT−The peak overshoot voltage 540 V in the comparative IGBT]/[The peak overshoot voltage 540 V in the comparative IGBT−The bus voltage 300 V]×100%).

As the effective impurity amount in shell region 5 exceeds $8.0 \times 10^{11}$ cm$^{-2}$ to the larger side, the peak overshoot voltage becomes high rapidly. When the effective impurity amount in shell region 5 is $9.0 \times 10^{11}$ cm$^{-2}$ for example, the peak overshoot voltage is around 570 V. In this case, the increasing rate of the peak overshoot voltage exceeds 10% to the higher side. Here, ([The increasing rate of the peak overshoot voltage in the example IGBT]≈[570 V−540 V]/[540 V−300 V]×100%). Therefore, it is preferable to set the effective impurity amount in shell region 5 to be $8.0 \times 10^{11}$ cm$^{-2}$ or smaller.

When the effective impurity amount in shell region 5 is $5.0 \times 10^{11}$ cm$^{-2}$, the peak overshoot voltage is around 550 V. In this case, the increasing rate of the peak overshoot voltage in the example IGBT is set to be almost 0%, if compared with the comparative IGBT. Here, ([The increasing rate of the peak overshoot voltage in the example IGBT]≈[550 V−540 V]/[540 V−300 V]×100%). Therefore, it is desirable obviously to set the effective impurity amount in shell region 5 to be $5.0 \times 10^{11}$ cm$^{-2}$ or smaller.

FIG. 9 is a wave chart describing the reverse recovery voltage waveform and the reverse recovery current waveform in the reverse blocking IGBT according to the invention. FIG. 10 is a wave chart describing the reverse recovery voltage waveform and the reverse recovery current waveform in the conventional reverse blocking IGBT.

The voltage waveform and current waveform of the example IGBT during the reverse recovery thereof (reverse recovery waveforms) are measured. The effective impurity amount in shell region 5 is set at $1.0 \times 10^{11}$ cm$^{-22}$. The reverse recovery waveforms of the comparative IGBT used in FIG. 7 are measured. In the measurement, the bus voltage is 300 V and the reverse recovery current is 10 A/cm$^2$.

As described in FIGS. 9 and 10, period 151, in which reverse recovery current described in FIG. 9 (cf. the broken curve in FIG. 9) overshoots from a negative value and, then, converges to zero, is shorter than period 152, in which the reverse recovery current described in FIG. 10 (cf. the broken curve in FIG. 10) overshoots from a negative value and, then, converges to zero. (Hereinafter, periods 151 and 152 will be referred to as "converging periods 151 and 152", respectively.) In other words, it has been revealed that the reverse recovery waveforms of the example IGBT recover more quickly than the reverse recovery waveforms of the comparative IGBT. Any waveform oscillation is not caused on the reverse recovery waveforms of the example IGBT.

It is estimated that the reverse recovery current is prevented from increasing, since minority carries are stored in shell region 5 in the diode formed of base region 2 and shell region 5 in the ON-period of the reverse blocking IGBT. It is estimated also that the reverse recovery waveforms recover faster, as the effective impurity amount in shell region 5 is smaller. The reverse recovery waveforms are most liable to oscillation under the conditions, under which the bus voltage is 300 V and the reverse recovery current is 10 A/cm$^2$. This tendency is steady, even if the conditions are changed variously. Therefore, it is desirable to set the effective impurity amount in shell region 5 to be $1.0\times10^{11}$ cm$^{-2}$ or smaller.

FIG. 14(a) is a cross sectional view showing a part of the active region in the reverse blocking IGBT according to a second embodiment of the invention.

The active region in the reverse blocking IGBT according to the second embodiment is different from active region 100 in the reverse blocking IGBT according to the first embodiment as described below. The active region in the reverse blocking IGBT according to the second embodiment includes leakage current stop layer (hereinafter referred to as "LCS layer") 12 of the n-type (first conductivity type) between collector region 10 and drift region 1. The structures of the breakdown withstanding region and the separation section in the reverse blocking IGBT according to the second embodiment are the same with the structures of breakdown withstanding region 120 and separation section 130 in the reverse blocking IGBT according to the first embodiment.

In FIG. 14(b), the electric field strength distribution at the forward bias voltage application is represented by solid lines and the electric field strength distribution at the reverse bias voltage application is represented by broken lines.

The impurity concentration in n-type LCS layer 12 is set such that the average impurity amount at the depth of 2 μm is $1.0\times10^{12}$ cm$^{-2}$ or smaller.

By disposing LCS layer 12, the leakage current at the forward bias voltage application is reduced. By disposing shell region 5 additionally as described earlier, the leakage current at the reverse bias voltage application is reduced. Since the breakdown withstanding performances are improved by the reductions of the leakage currents at the forward and reverse bias voltage applications, it becomes possible to reduce the drift region 1 thickness. As a result, the tradeoff relation between the ON-state voltage and the turnoff loss in the reverse blocking IGBT is improved as described in FIG. 15.

For suppressing the loss caused by the turnoff in the reverse blocking IGBT according to the second embodiment, it is necessary for the drift layer resistivity to be low enough to prevent the space charge region expanding at the reverse bias voltage application from the pn-junction between collector region 10 and LCS layer 12 from reaching shell region 5. It is also necessary for the drift layer resistivity to be low enough to prevent the space charge region expanding at the forward bias voltage application from the pn-junction between base region 2 and shell region 5 from reaching LCS layer 12.

As described above, shell region 5, the average n-type impurity amount therein is $8.0\times10^{11}$ cm$^{-2}$ or smaller, is formed between drift region 1 and base region 2 according to the invention. The drift region 1 resistivity is set to be low enough to prevent the depletion layer expanding from collector region 10 from reaching shell region 5. Therefore, the electric field in the substrate is relaxed more easily as compared with the conventional reverse blocking IGBT. Therefore, it is possible to improve the forward and reverse withstand voltages.

Due to the disposition of shell region 5 and drift region 1 described above, any reach-through phenomenon is not caused. Since any reach-through phenomenon is not caused, the turnoff voltage waveform and the turnoff voltage waveform (hereinafter referred to collectively as the "turnoff waveforms") are prevented from oscillating. By forming drift region 1 exhibiting the resistivity as described above, the depletion layer is made not to reach the shell region 5 during the reverse recovery.

Since the depletion layer is prevented from reaching the shell region 5, the oscillations caused on the reverse recovery waveforms are suppressed. Therefore, the oscillations of the turnoff waveforms and the reverse recovery waveforms are suppressed. Since the oscillations of the turnoff waveforms and the reverse recovery waveforms are suppressed, noises are prevented from causing and the semiconductor device is prevented from being broken down.

In the structure according to embodiments of the invention, all the n-type regions and layers may be replaced by p-type regions and layers and all the p-type regions and layers by n-type regions and layers with no problem.

The semiconductor device according to embodiments of the invention is applicable advantageously to the switching device, used in matrix converters and such series converter circuits and required to exhibit breakdown withstanding characteristics against the forward and reverse voltages.

This application is based on, and claims priority to, Japanese Patent Application No. 2009-298913, filed on Dec. 28, 2009. The disclosure of the priority application, in its entirety, including the drawings, claims, and the specification thereof, is incorporated herein by reference.

What is claimed is:

1. A semiconductor device comprising:
   a first semiconductor region of a first conductivity type;
   a second semiconductor region of a second conductivity type formed selectively in a surface portion of the first semiconductor region;
   a third semiconductor region of the first conductivity type formed selectively in a surface portion of the second semiconductor region;
   a first electrode crossing over the first semiconductor region from the third semiconductor region with an insulator film interposed between the first electrode and the first semiconductor region;
   a second electrode connected to the second semiconductor region and the third semiconductor region;
   a fourth semiconductor region of the first conductivity type between the first semiconductor region and the second semiconductor region, the fourth semiconductor region surrounding an entire lower boundary of the second semiconductor region;
   a fifth semiconductor region of the second conductivity type on a back surface of the first semiconductor region;
   a third electrode in contact with the fifth semiconductor region;
   the fourth semiconductor region being doped more heavily than the first semiconductor region, the fourth semiconductor region comprising an impurity of the first conductivity type at an average impurity amount of $8.0 \times 10^{11}$ cm$^{-2}$ or smaller; and the first semiconductor region exhibiting resistivity low enough to prevent a depletion layer expanding from the fifth semiconductor region from reaching the fourth semiconductor region;

the semiconductor device further comprising:

a sixth semiconductor region of the second conductivity type in, and covering, an edge area of the first semiconductor region, the sixth semiconductor region extending through the first semiconductor region from a front surface thereof to a back surface thereof, and the sixth semiconductor region being in contact with the fifth semiconductor region.

2. The semiconductor device according to claim 1, wherein the average impurity amount of the impurity of the first conductivity type in the fourth semiconductor region is $5.0 \times 10^{11}$ cm$^{-2}$ or smaller.

3. The semiconductor device according to claim 1, wherein the average impurity amount of the impurity of the first conductivity type in the fourth semiconductor region is $1.0 \times 10^{11}$ cm$^{-2}$ or smaller.

4. The semiconductor device according to claim 1, further comprising:

a breakdown withstanding region between an active region, therein the second semiconductor region, the third semiconductor region and the fourth semiconductor region are formed, and the sixth semiconductor region, the breakdown withstanding region surrounding the active region; and a seventh semiconductor region of the second conductivity type in a surface portion of the first semiconductor region in the breakdown withstanding region, a plurality of the seventh semiconductor region surrounding the active region.

5. The semiconductor device according to claim 1, wherein the first semiconductor region exhibits resistivity low enough to prevent a depletion layer expanding, when a reverse voltage equal to a rated voltage is applied, from the fifth semiconductor region toward the fourth semiconductor region from reaching the fourth semiconductor region.

6. The semiconductor device according to claim 1, further comprising:

an eighth semiconductor region of the first conductivity type between the first semiconductor region and the fifth semiconductor region, and the first semiconductor region exhibiting resistivity low enough to prevent a space charge region expanding from the second semiconductor region from reaching the eighth semiconductor region.

7. The semiconductor device according to claim 6, wherein an average amount of an impurity of the first conductivity type in the eighth semiconductor region is $1.0 \times 10^{12}$ cm$^{-2}$ or smaller.

* * * * *